`US009557658B2`

(12) United States Patent
Utsumi

(10) Patent No.: US 9,557,658 B2
(45) Date of Patent: Jan. 31, 2017

(54) LOW ENERGY ELECTRON BEAM LITHOGRAPHY

(71) Applicant: Takao Utsumi, Tokyo (JP)

(72) Inventor: Takao Utsumi, Tokyo (JP)

( * ) Notice: Subject to any disclaimer, the term of this patent is extended or adjusted under 35 U.S.C. 154(b) by 0 days.

(21) Appl. No.: 14/831,099

(22) Filed: Aug. 20, 2015

(65) Prior Publication Data
US 2016/0274474 A1    Sep. 22, 2016

(30) Foreign Application Priority Data
Jun. 24, 2014 (JP) ................... 2014-129712

(51) Int. Cl.
| | | |
|---|---|---|
| *H01J 37/147* | (2006.01) | |
| *H01J 37/04* | (2006.01) | |
| *G03F 7/20* | (2006.01) | |
| *H01L 21/3065* | (2006.01) | |
| *H01L 21/308* | (2006.01) | |
| *H01L 21/68* | (2006.01) | |

(52) U.S. Cl.
CPC ......... *G03F 7/70725* (2013.01); *H01L 21/308* (2013.01); *H01L 21/3065* (2013.01); *H01L 21/681* (2013.01); *H01L 21/682* (2013.01)

(58) Field of Classification Search
CPC ........ H01J 37/147; H01J 37/04; H01J 37/073; H01J 37/12; H01J 37/145; H01J 37/1471; H01J 37/20; H01J 37/244; H01J 37/252; H01J 37/28; H01J 37/304; H01J 37/3171; H01J 37/3174
USPC ............. 250/396 ML, 396 R, 311, 306, 397, 398,250/442.11, 492.1, 492.2, 492.21
See application file for complete search history.

(56) References Cited

U.S. PATENT DOCUMENTS

| | | | | |
|---|---|---|---|---|
| 3,308,294 A | * | 3/1967 | Ozasa | ................... H01J 37/147 250/398 |
| 3,615,466 A | | 10/1971 | Sahni | |
| 4,334,156 A | | 6/1982 | Bohlen et al. | |
| 4,591,540 A | | 5/1986 | Bohlen et al. | |
| 5,371,371 A | * | 12/1994 | Yamazaki | ............. H01J 37/073 250/396 ML |
| 5,831,272 A | | 11/1998 | Utsumi | |

(Continued)

OTHER PUBLICATIONS

Non-Final Office Action dated Apr. 7, 2014 received in U.S. Appl. No. 13/998,694, filed Nov. 25, 2013.

(Continued)

*Primary Examiner* — David A Vanore
(74) *Attorney, Agent, or Firm* — Fox Rothschild LLP; Robert J. Sacco; Carol E. Thorstad-Forsyth

(57) ABSTRACT

The system for drawing a pattern on a resist layer covering a semiconductor wafer, comprising an electron gun housing unit provided with a plurality of small-sized electron guns (wherein the housing unit has a hollow column section for releasing an electron beam, and a micro deflection unit is disposed inside for adjusting the inclination of the electron beam), a movable stage capable of moving in the X-Y directions, a wafer stage disposed on the movable stage to support a semiconductor wafer, a mask wafer having struts on its rear side for supporting membranes on which a pattern to be transferred is formed, a mask stage for holding the mask wafer, a matching detection unit for detecting a misalignment between the mask wafer and the semiconductor wafer, and an inclination means connected to the micro deflection unit and the matching detection unit for inclining the electron beam.

19 Claims, 8 Drawing Sheets

(56) References Cited

U.S. PATENT DOCUMENTS

| | | | |
|---|---|---|---|
| 6,069,684 A | 5/2000 | Golladay et al. | |
| 6,441,382 B1* | 8/2002 | Huang | H01J 37/3171 250/492.21 |
| 6,444,374 B1 | 9/2002 | Shimazu et al. | |
| 6,570,163 B1* | 5/2003 | El Gomati | H01J 37/244 250/397 |
| 6,627,392 B2 | 9/2003 | Pforr et al. | |
| 6,717,157 B2 | 4/2004 | Utsumi | |
| 6,894,295 B2 | 5/2005 | Shimazu et al. | |
| 6,955,993 B2 | 10/2005 | Omori et al. | |
| 6,969,571 B2 | 11/2005 | Noudo et al. | |
| 7,417,240 B2* | 8/2008 | Kyek | H01J 37/026 250/251 |
| 7,462,428 B2 | 12/2008 | Koike | |
| 7,644,389 B2 | 1/2010 | Hennig et al. | |
| 2004/0013949 A1 | 1/2004 | Kagami | |
| 2004/0070771 A1 | 4/2004 | Ausschnitt | |
| 2004/0081897 A1 | 4/2004 | Koike | |
| 2005/0116185 A1 | 6/2005 | Mizuno | |
| 2005/0142462 A1 | 6/2005 | Omori et al. | |
| 2005/0145892 A1 | 7/2005 | Nohdo et al. | |
| 2005/0170265 A1 | 8/2005 | Moriya | |
| 2005/0199827 A1* | 9/2005 | Nagano | B82Y 10/00 250/492.1 |
| 2005/0208395 A1 | 9/2005 | Noudo et al. | |
| 2006/0040512 A1 | 2/2006 | Im | |
| 2006/0043595 A1 | 3/2006 | Aratani et al. | |
| 2006/0097184 A1* | 5/2006 | Frosien | H01J 37/145 250/396 R |
| 2006/0127824 A1 | 6/2006 | Koike | |
| 2006/0143172 A1 | 6/2006 | Ashida et al. | |
| 2007/0054203 A1 | 3/2007 | Moriya et al. | |
| 2007/0068451 A1 | 3/2007 | Nomura | |
| 2007/0105026 A1 | 5/2007 | Yoshizawa et al. | |
| 2007/0111116 A1 | 5/2007 | Noudo et al. | |
| 2008/0078954 A1* | 4/2008 | Vanderberg | H01J 37/04 250/492.21 |
| 2008/0268353 A1 | 10/2008 | Kim et al. | |
| 2009/0170013 A1 | 7/2009 | Kim | |
| 2010/0001202 A1* | 1/2010 | Matsuda | H01J 37/12 250/396 R |
| 2010/0167207 A1 | 7/2010 | Tanaka et al. | |
| 2011/0297841 A1* | 12/2011 | Caporaso | H01J 37/04 250/396 ML |
| 2012/0097863 A1* | 4/2012 | Saho | H01J 37/08 250/443.1 |
| 2013/0260289 A1 | 10/2013 | Lin et al. | |

OTHER PUBLICATIONS

Final Office Action dated Jul. 15, 2014 received in U.S. Appl. No. 13/998,694, filed Nov. 25, 2013.

Non-Final Office Action dated Nov. 12, 2014 received in U.S. Appl. No. 13/998,694, filed Nov. 25, 2013.

* cited by examiner

LOW ENERGY ELECTRON BEAM LITHOGRAPHY

FIELD OF THE INVENTION

The present invention relates to the production of an integrated circuit device in which the size of an object having a minimum characteristics is about 10 nm to 20 nm, and particularly to a device and a method used for such a production.

BACKGROUND OF THE INVENTION

An important portion of the production of integrated circuits is patterning on the surface of a semiconductor wafer (which is cut into small pieces after processing to make integrated circuit devices). Such patterning defines various regions within an integrated circuit device including ion implantation regions, contact window regions and bonding pad regions, and is generally formed by transferring a geometrical shape pattern of a mask to a thin layer of a photosensitive material (which is called a "resist") covering a silicon wafer, which forms an integrated circuit device. The pattern of a mask is typically enlarged, and therefore it needs to be reduced for the purpose of projection to a resist.

Currently, the pattern transfer process is generally carried out by photolithography, and radiation energy used for the transfer has optical wavelengths.

If a pattern formed on a resist, i.e., an object having a characteristic is small, the packaging density of circuit elements within an integrated circuit becomes high, and therefore the wavelengths of optical radiation used for transfer need to be short accordingly. It seems that this technology is approaching its limits for usefully using optical radiation necessary for drawing a pattern on a resist in an appropriate manner.

There are recently several other technologies including extreme ultraviolet radiation and electron beams, which it is believed can be used at the time of transferring a geometrical pattern of a mask to a resist layer.

Electron beams (which can be controlled minutely and accurately) recently started being used mainly at the time of producing masks for which optical lithography is now used. Electron beams are used for directly writing a pattern on a resist on a silicon wafer, but such usage is limited to customized circuits for small-quantity production which are sold at high prices.

The difficulty in the use of electron beams used for drawing patterns on a resist at the time of producing an integrated circuit causes a decline in throughputs by such a use, and the difficulty in the use thereof is also caused by the fact that an electron beam exposure system is comparatively expensive. Accordingly, there is generally no likelihood of using an electron beam exposure system, and efforts to develop a commercially available system for such a use have been limited.

In an electron beam lithography system explained in a thesis titled "High Throughput Submicron Lithography with Electron Beam Proximity Printing" (published in September 1984, Solid State Technology, pp. 210-217), electron beams are operated by 10 KV energy (which used to be regarded very low), the thickness of a stencil mask is 2 microns (which is thinner than that of conventional ones), and the interval between a mask and wafer is 5 mm (500 microns) (which is regarded very small). Its electron beams (whose diameter is about 1 mm (1000 microns), which is very small as compared with the entire region of a mask) was raster-scanned with a pair of first deflection coils in such a manner as to traverse the mask. A pair of second deflection coils was used for inclining beams around a pivot point on the mask surface. A silicon wafer containing a membrane having a thickness of 2 microns served as a mask. With such a mask and electrons having 10 KV energy, it was necessary to have a proper metallic absorption layer on the mask in order to block beams that were not directed toward the opening section of the mask. Otherwise, such beams pass through a thin membrane of a thin silicon mask and thereby obfuscates a pattern to be formed on a resist. However, the use of a thicker silicon mask makes it difficult to shorten the (drawing) line width. This is because the aspect ratio of the line width to the mask thickness is too high.

However, it appears that this thesis hardly made any impact on researches in this field such that efforts on such a proximity projection printing system declined after 1984. Research on the electron beam exposure system was rather directed toward a system in which electrons in electron beams have high energy in order to give "rigidity" to electron beams. Beams having rigidity can be controlled well in terms of beam diameter and focused very well, make sharp images and furthermore are not influenced by any leakage electric field. Rigidity is generally related to the energy or speed of electrons within a beam, and as energy increases, the rigidity of the beam goes higher.

For this reason, in commercial use, it is general to use electrons having at least 50 KV energy in order to achieve high resolution. The device using such a beam is generally constituted of a system in which an electron beam from an electron source is formed by focusing and then irradiated to a mask, and a projection system in which a beam passing through a lens and then a mask is reduced and then projected to a resist, wherein the reduction ratio is $\frac{1}{5}$ to $\frac{1}{25}$.

However, when the density of circuit elements within an integrated circuit increases and thereby the size of an object having a characteristic of a resist pattern is reduced, problems occur for use of high energy beams. Particularly, the proximity effect (which distorts a pattern to be formed as a result of the backscattering of beams emitted from a silicon wafer substrate on the lower side to a resist) increases. This effect becomes more and more problematic as a pattern to be formed on a resist is miniaturized more and more. However, it is known that as the accelerating voltage is increased, forward scattering within a resist is reduced, electrons that are backscattered due to the substrate are scattered over a wide area, and as a result, the amount of dose becomes relatively constant. This does not mean to completely remove the proximity effect though it makes easier to correct the proximity effect. Furthermore, the increase of electron energy means that electrons pass through a resist quickly without releasing much energy, and therefore the resist sensitivity per electron tends to decline. Therefore, as energy is increased, electric current necessary for certain sensitivity becomes higher (i.e., the density of electrons within a beam increases). Moreover, as the density of electrons within a beam increases, the beam is defocused more and more, and the resolution of a pattern is lowered. In addition, as the electric current is increased, a mask, a resist layer and a substrate are heated more, and thereby a projection pattern is distorted accordingly. Hence, in order to maintain necessary accuracy, operating current must be limited. This results in the limitations of throughputs of a device.

In order to address some of those problems, the use of low energy electron beams to draw a pattern on a resist newly attracted some attention for a certain period. Particularly, a thesis titled "Low voltage alternative for electron beam lithography" (J Vac. Cci Tech B 10(6), November/December 1992, pp. 3094-3098) reported that the proximity effect substantially declined by using electrons having relatively low energy within a beam. One of main objectives of the research was to show that even when a very thin resist necessary for using an electron beam having low energy was used, a pattern on a resist could sufficiently be transferred to a substrate. However, such electrons tend to be low in terms of brightness at a low voltage, and therefore it was acknowledged that the application of ultrathin resist layers was difficult.

As a result, it has long been acknowledged that electron beams having low energy are suitable for drawing patterns on a resist and have potential advantages. However, when an electron beam having low energy is raster-scanned in such a manner as to traverse a mask using first deflection coils, the passage of the electron beam is elongated, and thereby the electron beam is influenced by Coulomb interaction (space charge effect). When the current density increases, its influence is further added. As a result, disadvantages excel advantages, and therefore as a method of mass-producing devices, this method has not widely been used yet for commercial use. Nevertheless, substantial development efforts to use low-voltage lithography have recently been made using (1) retarding field electron beam columns, (2) multiple sequence reduced electron beam columns, and (3) the tip ends of multiple sequence scanning tunnel microscopes.

On Oct. 31, 1997, the present inventor filed a patent application in which the title of the invention was "Low Energy Electron Beam Lithography" (which was granted as U.S. Pat. No. 5,831,272 issued on Nov. 3, 1998) (Patent Document 1). Patents were granted for the corresponding applications in Japan and Germany. One embodiment described in U.S. Pat. No. 5,831,272 is a system for patterning a resist on a semiconductor substrate and comprises a 1× stencil mask made of single crystal silicon disposed in the passage of electron beams, and the substrate covered with an electron-sensitive resist within the passage of electron beams and a mask. The resist is thin; the beam accelerating voltage is sufficiently low so that the proximity effect hardly occurs; the beam voltage is sufficiently low so that the mask, the resist and the substrate are hardly heated; and the electron density of a beam is sufficiently low so that the space charge effect hardly occurs. The electron beam accelerating voltage is about 2 KV (in the range of about 1 KV to 5 KV); the resist has a thickness of 100 nm (in the range of 30 nm to 300 nm); the electron beam current is about 3 microamperes (in the range of about 0.3 microamperes to about 20 microamperes); the beam diameter is about 1.0 mm (in the range of about 0.1 mm to about 5 mm); and the mask is a stencil mask having a thickness of about 500 nm (in the range of about 200 nm to 1000 nm). The error in the alignment between a mask and a semiconductor wafer is maintained to be about 15 nm or less. It was known that by 2007, the "LOW ENERGY ELECTRON BEAM LITHOGRAPHY SYSTEM" described in U.S. Pat. No. 5,831,272 would be produced, tested and operated.

FIG. 9 shows a schematic view of an exposure device disclosed in U.S. Pat. No. 5,831,272.

An exposure device 90 in FIG. 9 comprises an electron gun 93 for generating a low-velocity electron beam 92, aperture 94, a condenser lens 95, a pair of main deflectors 96, 97, and a pair of deflectors for fine adjustments 98, 99. The aperture 94 limits the electron beam 91. The condenser lens 95 converges the electron beam 91 to make parallel beams. The main deflectors 96, 97 and the deflectors for fine adjustments 98, 99 are deflection coils, and the main deflectors 96, 97 deflect the electron beams 91 in such a way that the electron beam 91 becomes incident basically perpendicularly on the surface of the stencil mask 90. The electron beam 91 is scanned in such a way as to sweep over the upper surface of the stencil mask. By an electron beam passing through a hole 101 section of the stencil mask 100, a resist 103 on a wafer 102 is exposed.

It was discovered that the use of this system enabled to make the size of an object having a characteristic to less than 1 micron, potentially to about 45 nm. A considerable number of tests were conducted in order to determine the limits of the size of an object having a characteristic while maintaining the level of throughputs high enough to be commercially feasible.

SUMMARY OF THE INVENTION

A considerable amount of work has been done since 1997 for enhancing a previous system (i.e., ArF immersion lithography) for transferring an image contained in a mask to a semiconductor wafer in order to form an integrated circuit made for mass production. This popularized technology brought about a system capable of producing an integrated circuit for mass-production in which the size of an object having a characteristic is about 40 nm or less.

The present invention has significantly improved the results obtained by using a device described in U.S. Pat. No. 5,831,272, the contents of which are incorporated into the present specification for reference. The device and operation parameters are significantly different based on the research conducted by the present inventor over 16 years in order to improve the previous invention.

For several more years, it is desirable to further improve the lithography system to one capable of producing an integrated circuit in which the size of an object having a characteristic is in the range of 10 nm to 20 nm. The size of some of those objects is the length of a gate of metal oxide silicon transistors and the width of metal conductors. Proposed systems such as the ArF double patterning and the EUV lithography system are complicated and expensive, and supposing those systems have been implemented, it is not sure whether or not those systems have widely been used.

The present invention relates to a system for integrated circuits to be mass-produced, for patterning an object having a characteristic whose minimum size is in the range of about 10 nm to 20 nm, and for low-energy electron beam lithography with sufficient throughputs and accuracy.

In one embodiment, the present invention is an electron system for drawing a pattern on an electron-sensitive resist layer covering a semiconductor wafer. The present system comprises an electron gun housing unit provided with a plurality of small-sized electron guns arranged in parallel with each other. The electron guns provided in the electron gun housing unit form electron beams, which are linear and in parallel with each other, along the central axis line; each of the electron guns has a hollow column section for emitting the formed electron beam; and a micro deflection unit is disposed inside the column section for adjusting the inclination of the electron beam passing inside by a minute angle. Below the electron gun housing unit are disposed a movable stage capable of moving in the X-Y directions, a wafer stage disposed on the movable stage to support a semiconductor wafer, and a mask stage that holds a mask wafer peripherally and is disposed at a prescribed position above the semiconductor wafer held on the wafer stage in such a manner as to be integrated with the wafer stage, wherein the mask wafer has at least one n division complementary mask (n is equal to or greater than 2), which has struts on the rear side for supporting membranes in which a pattern to be transferred to the resist layer is formed.

The present invention further comprises a matching detection unit and an inclination means. The matching detection unit detects a misalignment between the integrated mask wafer and semiconductor wafer. The inclination means has an input connected to an output of the matching detection unit in order to generate a correction signal in its output, which is then connected to an input of the micro deflection unit in order to compensate for a misalignment between the mask wafer and the semiconductor wafer and minimize a placement error of the pattern.

The movable stage is moved in the X direction and the Y direction so that electron beams emitted from a plurality of hollow columns of the electron gun housing unit can be irradiated over the surface of a mask wafer held on the mask stage.

The accelerating voltage of an electron beam is in the range of about 0.5 KV to about 5 KV, the electric current of an electron beam is in the range of about 50 microamperes to about 1000 microamperes, and the diameter of an electron beam is in the range of about 1 mm to about 9 mm.

The mask wafer may have a contact convection section at least on a portion of a place corresponding to a strut on its front side, and in this case, when the mask wafer is disposed above a semiconductor wafer, it comes into contact with the abovementioned resist layer of the abovementioned semiconductor wafer via the contact convection section.

The thickness of the resist layer is in the range of about 10 nm to about 300 nm; the thickness of the membrane is in the range of about 50 nm to 500 nm; the resist layer of the semiconductor wafer is separated from the mask wafer disposed above the semiconductor wafer in the range of about 10 μm to about 300 μm.

The semiconductor wafer is positioned under the resist layer and comprises a non-metallic conductive layer having a thickness in the range of about 50 nm to 500 nm.

In another embodiment, the semiconductor wafer is a chip semiconductor wafer having a plurality of regions on which individual integrated circuits are formed.

Furthermore, in another embodiment, the present invention is a method for drawing a pattern on an electron-sensitive resist layer, which covers a non-metallic conductive layer covering a semiconductor wafer, in the production of silicon integrated circuits. The present method comprises the following steps.

A step of disposing a wafer stage that is positioned below an electron gun housing unit provided with a plurality of small-sized electron guns, which are arranged in parallel with each other, and holds a semiconductor wafer on a movable stage, which can be moved in the X-Y directions, wherein: each of the abovementioned electron gun forms a linear electron beam along the central axis line; each of the abovementioned electron gun has a hollow column section for emitting the formed electron beam; and a micro deflection unit is disposed inside the column section for adjusting the inclination of the electron beam passing inside by a minute angle.

A step of disposing the abovementioned mask wafer above the semiconductor wafer held by the wafer stage by using a mask stage holding the mask wafer peripherally, the mask wafer having at least one n division complementary mask (n is equal to or greater than 2), which has struts on the rear side for supporting membranes, on the inner side of which a pattern to be transferred to the resist layer is formed.

A step of moving the movable stage in the X direction and the Y direction in order to irradiate electron beams emitted from the plurality of hollow columns of the electron gun housing unit over the surface of the mask wafer held by the mask stage.

A step of detecting a misalignment between the mask wafer and the semiconductor wafer and generating a misalignment correction signal; and a step of applying the correction signal to the micro deflection unit for adjusting the inclination of the electron beams in order to compensate for the misalignment between the mask wafer and the semiconductor wafer and minimize a placement error of the pattern.

A step of moving the abovementioned movable stage in the X direction and the Y direction so that electron beams emitted from a plurality of hollow columns of the electron gun housing unit can be irradiated over the surface of a mask wafer held on the mask stage. As a result, a pattern on membranes can be transferred to the resist layer.

The mask wafer may have a contact convection section at least on a portion of a place corresponding to a strut on its front side, and in this case, when the mask wafer is disposed above a semiconductor wafer, it comes into contact with the abovementioned resist layer of the abovementioned semiconductor wafer via the contact convection section.

The present invention can further be understood by the following description given in detail in conjunction with attached drawings. The scale used in drawings does not necessarily reflect accurate sizes.

MODE FOR IMPLEMENTING THE INVENTION

Figure 1:
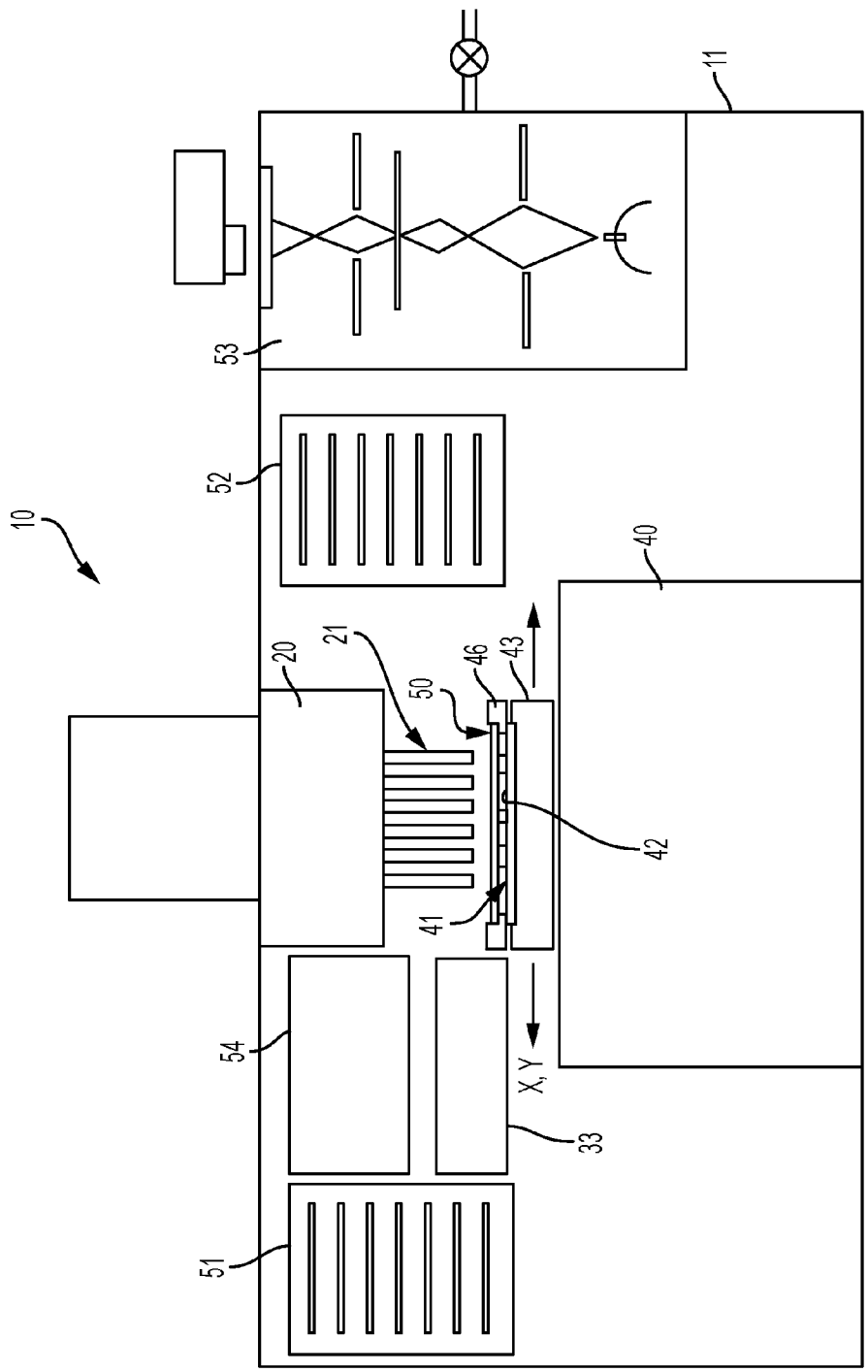
FIG. 1 is a schematic view of a lithography system using low energy electron beams according to the present invention.

FIG. 1 shows a system (electron beam device) 10 according to the present invention. The system 10 has a casing 11, which contains the entire device and is provided with constituent elements as explained below inside. At the upper center section, an electron gun housing unit 20 is disposed. Within the electron gun housing unit 20, a plurality of electron guns is disposed in parallel with each other. FIG. 1 shows a hollow column 21 extending downward from each electron gun. In FIG. 1, only six columns extend due to the limitations of drawing, but a larger number of columns (and also electron guns) may be provided. Preferably, 10 columns (therefore 10 electron guns) are provided.

Within the housing 11 are disposed a movable stage 40, which can be moved in the X-Y directions, below the electron gun housing unit 20, a wafer stage 43 that is disposed on the movable stage and holds a semiconductor wafer 41, and a mask stage 46 that peripherally holds the mask wafer (stencil mask) 50 provided with a plurality of n division complementary masks (n is equal to or greater than 2) and is disposed above the semiconductor wafer 41 held on the wafer stage 43 in such a manner as to be integrated with the wafer stage.

Within the housing 11 are also disposed a semiconductor wafer storage unit 51 for storing processed and unprocessed semiconductor wafers, a mask wafer storage unit 52 for storing mask wafers 50, and a monitoring unit 53 for inspecting mask wafers and processed semiconductor wafers. Each unit is also used in the prior art, and therefore no particular explanation is necessary here.

Figure 2:
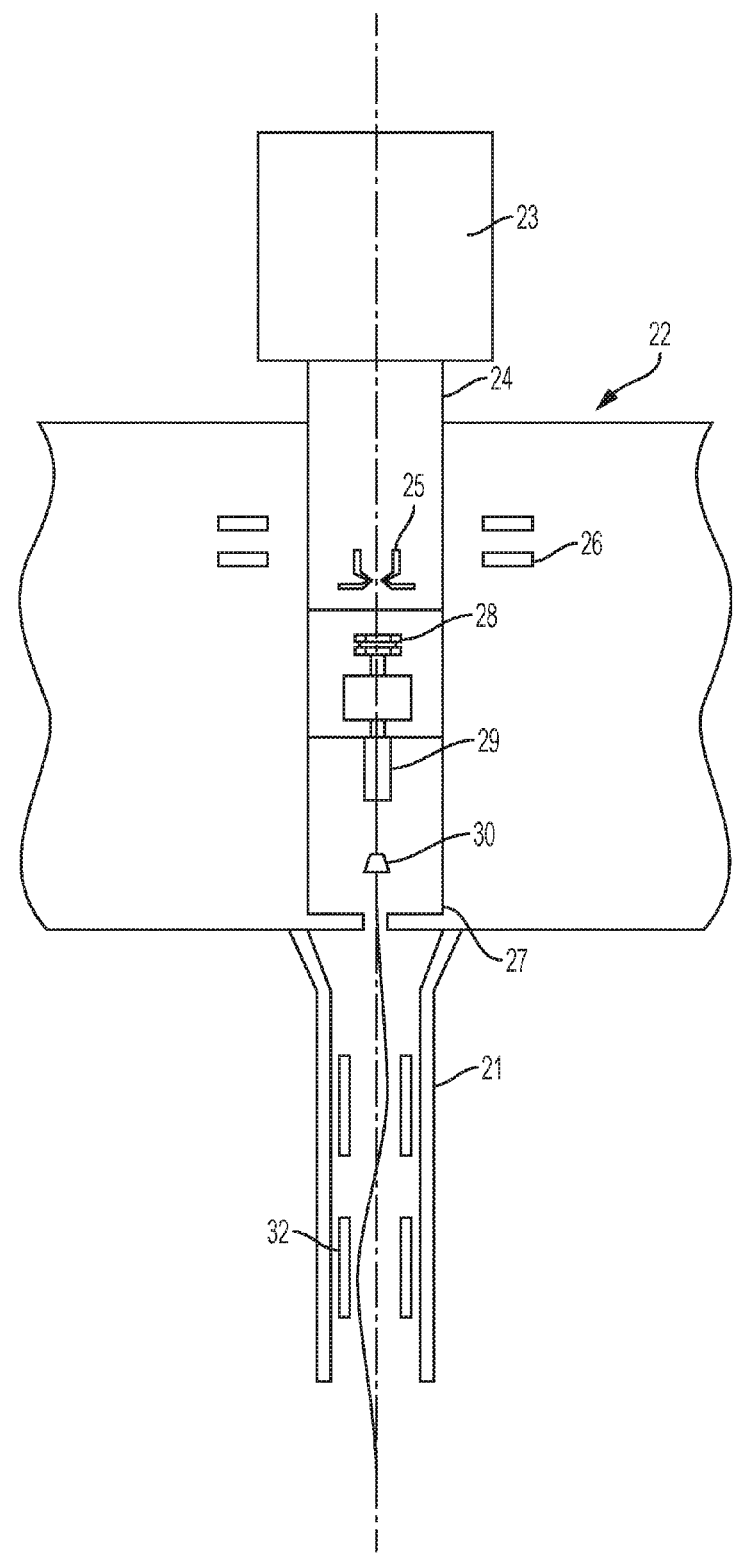
FIG. 2 shows the cross-section of one of electron guns disposed in an electron gun housing in FIG. 1.

FIG. 2 shows one electron gun 22. The constitution for generating electron beams is the same as one in the prior art, and therefore only the basic constitution is explained here. On the upper section of the electron gun 22, a vacuum pump 23 is provided for vacuuming inside. Although the vacuum pump 22 is provided for each gun 22, only one vacuum pump may be provided, wherein the vacuum pump is connected to individual electron guns. On the lower section of the vacuum pump 23, a hollow upper main body 24 is extended, and there is an emitter 25 inside, from which electrons are emitted. Outside the upper main body 24, an emitter adjustment coil 26 is disposed.

To the lower section of the upper main body 24, a hollow lower main body 27 is connected. Around the central axis line of the lower main body 27, an electron beam adjustment coil 28 is disposed. This coil 28 forms parallel electron beams having prescribed energy along the central axis line out of electrons coming into the lower main body.

Furthermore, a beam blanker 29 is provided around the axis line and a beam stopper 30 near the axis line. Although an electron beam normally takes a path on the axis line, it is possible to make it deviate from the axis line by means of the beam blanker 29 and take a path that leads to the stopper 30.

From the lower end of the lower main body 27, a hollow column 21 is extended. Within this column 21, a micro deflection unit (inclined electrode) 32 is disposed for inclining an electron beam by a minute angle. This inclined electrode is not to scan an electron beam but to adjust the inclination of an electron beam passing through a hole provided on a stencil mask, as described below, by a minute angle.

The operating beam voltage of an electron beam formed by an electron gun is in the range of about 0.5 KV to about 5 KV and is about 2 KV in a preferable embodiment, and the beam current is in the range of about 50 microamperes to about 1000 microamperes and is about 200 microamperes in a preferable embodiment. The diameter of an electron beam is in the range of about 1 mm to about 9 mm and is about 3 mm in a preferable embodiment. The diameter and length of the hollow column 21 are 30 mm and 15 cm, respectively, for example. The inclination angle that can be implemented by the micro deflection unit is +/−1 mrad.

The electron beam emitted from the column 21 is calibrated by an electron beam calibration unit 33.

As shown in FIG. 1, the wafer stage 43 disposed on the movable stage 40, which can be moved in the X-Y directions, holds the semiconductor wafer 41. The semiconductor wafer 41 is relatively large-sized single crystal silicon, and the upper surface of the wafer 41 is covered with a conductive layer, which is in turn covered with an electron-sensitive resist layer 42 to which a pattern is transferred. The conductive layer is made of a non-metallic conductor, typically a material such as hydrocarbon or amorphous carbon. The electron-sensitive resist layer 42 has a thickness of about 20 nm in a preferable embodiment, but it may have a thickness in the range of about 10 nm to 300 nm. The conductive layer typically has a thickness of about 50 nm, but it may be thicker than that.

Figure 3:
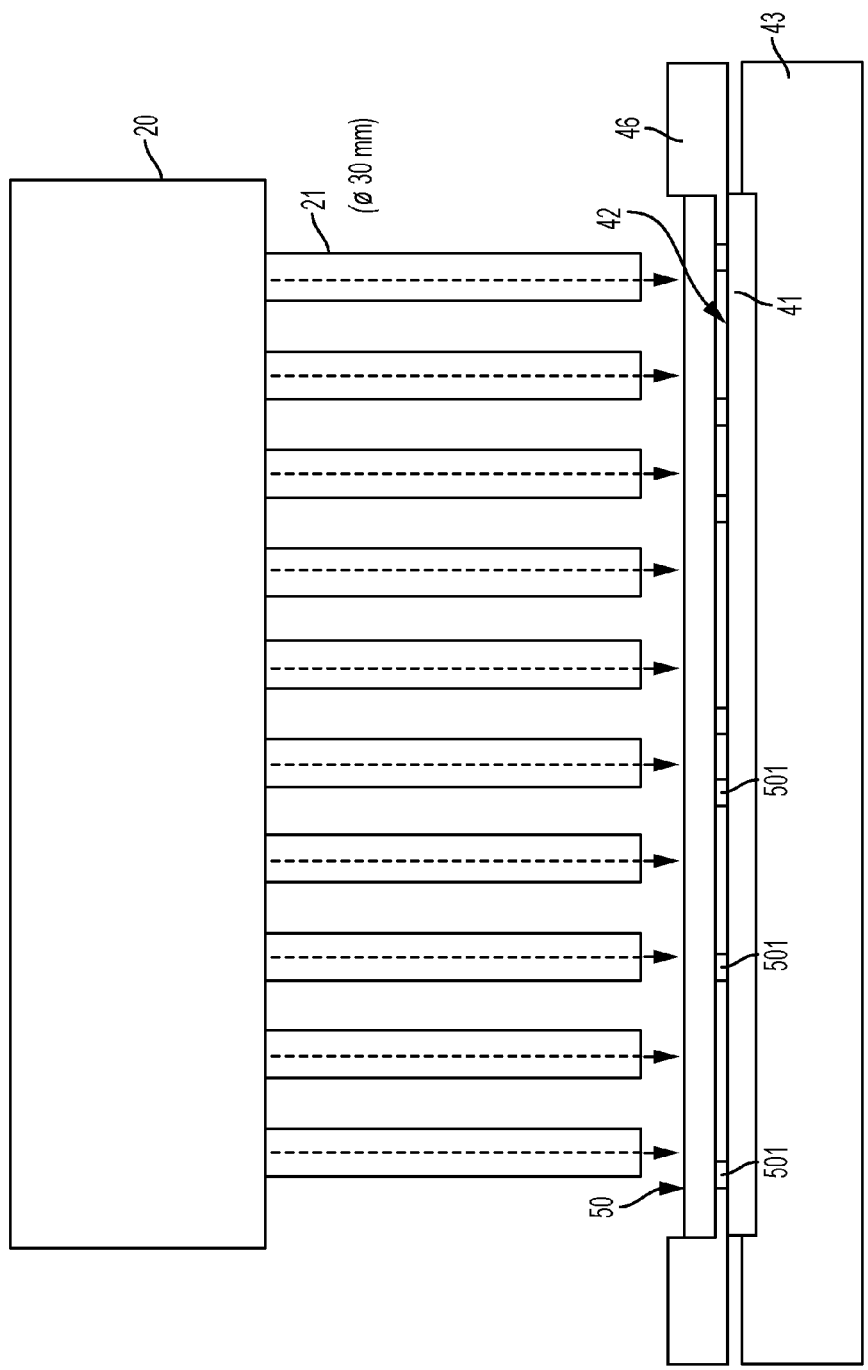
FIG. 3 is a partially enlarged view of electron gun columns and a mask stage and a wafer stage disposed on the lower side.

FIG. 3 shows a partially enlarged view of a plurality of columns 21 protruding from the electron gun housing unit 20, the mask stage 46, and the wafer stage 43. The mask stage 46 has an opening at its center, holds a mask wafer peripherally and is disposed at a place about 50 microns away from the semiconductor wafer 41 (mask wafer) in such a manner as to be integrated with the wafer stage 43.

As described below, on the front side (the lower surface in the drawing) of the mask wafer 50, a contact convection section 501 is provided (see FIG. 6 (*b*)). By means of the mask stage 46, the contact convection section 501 comes into contact with the resist layer 42 when the mask wafer 50 is disposed above the semiconductor wafer 41.

By means of the mask stage 46 and the wafer stage 43, a semiconductor wafer and a mask wafer are brought into a fixed state. By using the movable stage 40 that can be moved in the X-Y directions, a mask wafer and a semiconductor can be moved together horizontally below the column 21.

In order for a pattern drawn on an n division complementary mask provided on a mask wafer to be transferred to a prescribed position on a semiconductor wafer, it is necessary for the mask wafer and the semiconductor wafer to be matched with each other accurately to an accuracy of 50 nm or less. Furthermore, a pattern alignment error detection unit 54 is used for detecting alignment errors between patterns on the mask wafer and semiconductor wafer within the housing 11 (see FIG. 1).

As described above, by means of the mask stage 46 and the wafer stage 43, a semiconductor wafer and a mask wafer are brought into a fixed state and, in that fixed state, stored in the pattern alignment error detection unit 54, wherein a positional misalignment between the patterns on the mask wafer and patterns on the semiconductor wafer is detected under a microscope.

The detection method includes, but is not limited to, a method of disposing a mask wafer and a semiconductor wafer, which are fixed by the wafer stage and the mask stage, on a table (not shown here) that is provided within the pattern alignment error detection unit 54 and can minutely be rotated around the X-axis, Y-axis and Z-axis. Under a microscope, an alignment mark formed on each pattern on the semiconductor wafer is observed through an alignment hole formed on the corresponding pattern on the mask wafer. If there is no positional misalignment, the mark on the semiconductor is on the optical axis of the microscope, which perpendicularly passes through the alignment hole on the mask wafer. If there is a positional misalignment, the mark is not on the optical axis, and therefore the table is minutely rotated around the X-axis, Y-axis and Z-axis so that the mark can be on the optical axis. By calculating a positional misalignment based on the rotational angle of each axis, the minute inclination angles of the electron beam are determined.

The mask wafer is heated because it is exposed to an electron beam. Heat caused by this heating is transmitted to the resist layer 42 and then to the semiconductor wafer 41 through the contact convection section 501.

Figure 5:
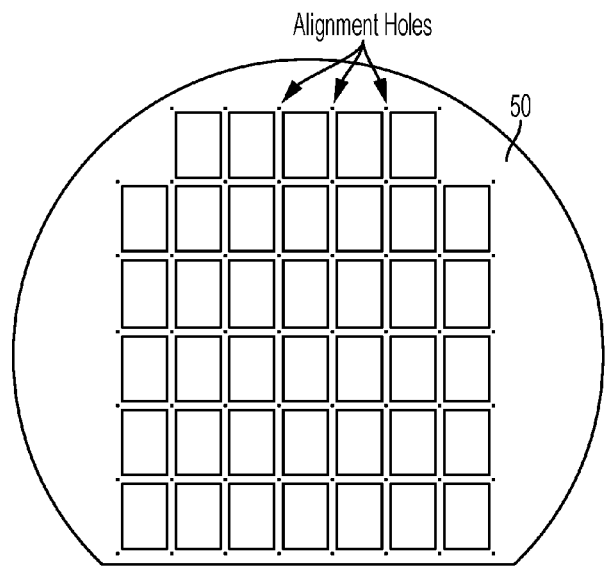
FIG. 5 shows a mask wafer provided with a plurality of one (one kind) of n pieces in n division complementary masks.

The mask wafer is a stencil mask. The mask wafer 50 is provided with at least one n division complementary mask, wherein the n division complementary mask has membranes, on which a pattern to be transferred to the resist layer of a semiconductor wafer is formed, and struts that support those membranes. Since a membrane is provided with a hole through which an electron beam passes, at least two complementary masks (n division complementary masks, wherein n is equal to or greater than 2) are used in order to draw one pattern. FIG. 5 shows a mask wafer provided with a plurality of one type of complementary masks from among n division complementary masks, i.e., n complementary masks.

Figures 4A, 4B:
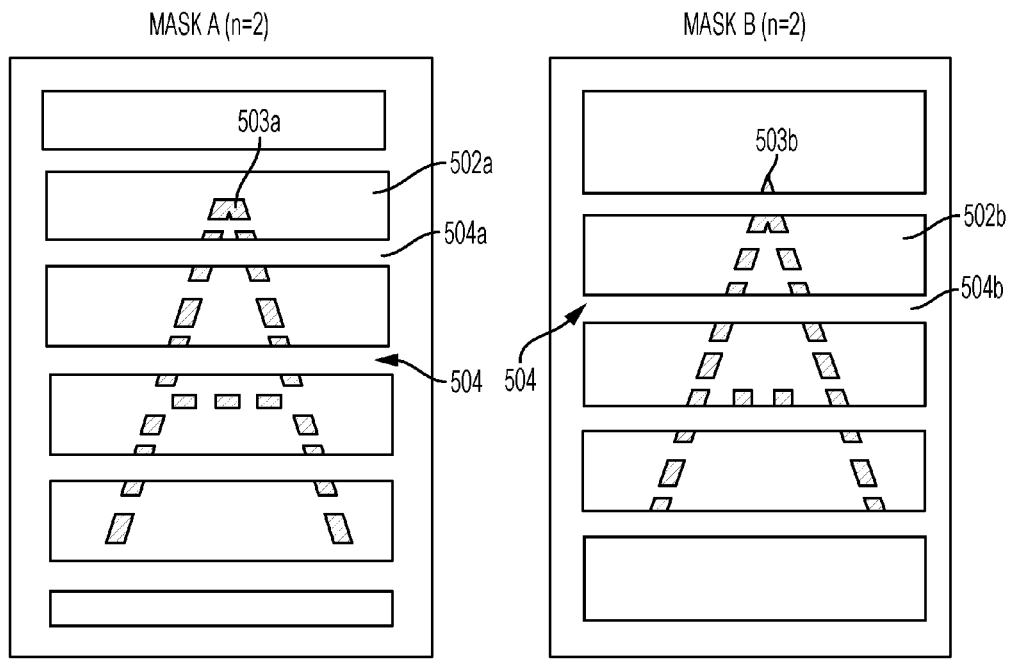
FIG. 4(a) shows a master mask having a pattern and FIG. 4(b) shows a master mask having a pattern which is complimentary to the pattern shown in FIG. 4(a).

The present mask wafer is made by NIL (Nanoimprint Lithography) using master masks. A description is given below for a case in which n is two, i.e., two division complementary masks. FIG. 4 (*a*) shows a master mask (a) having one pattern, and FIG. 4 (*b*) shows a master mask (b) having the other pattern. A hole 503*a* of the master mask (a) is complementary to a hole 503*b* of the master mask (b), and by combining them, a pattern "A" is formed. Portions 502*a* and 502*b* correspond to membranes, and portions 504*a* and 504*b* corresponds to struts (those phases are shifted so that they can be complementary to each other). FIG. 5 is a mask wafer formed by the NIL technology, which is a well-known technology, using a master mask. A square portion in the drawing show one of the two division complementary masks. Corners of square portions on the mask wafer are provided with holes (black spots on four corners in FIG. 5) to be used for detecting a positional misalignment. Holes (black spots) shown in the drawing are drawn larger than the actual size in order to facilitate understanding.

Figure 6A:
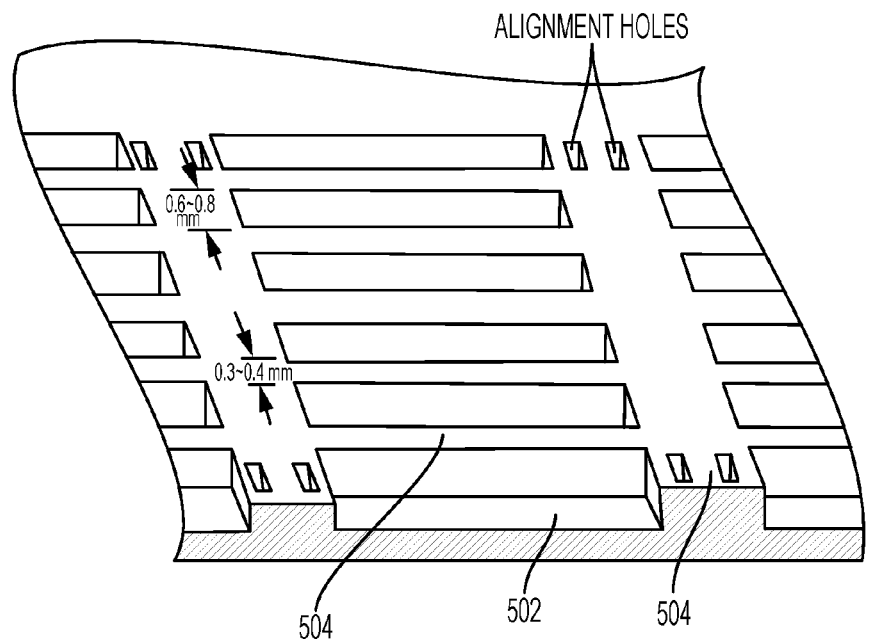
FIG. 6 (a) shows a partially enlarged perspective view of a mask wafer having a plurality of parallel struts (having membranes in between), and FIG. 6 (b) shows a partially enlarged perspective view of the front side of the mask wafer.
Figure 6B:
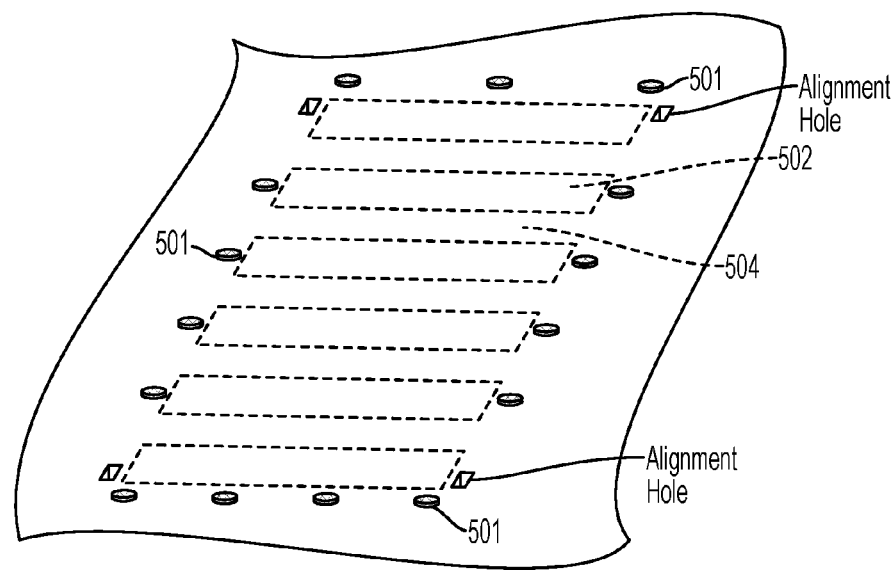

FIG. 6 (*a*) is a partial perspective view of a mask wafer produced by NIL using a master mask. Struts 504 are extended in parallel with each other, and there are membranes 502 therebetween. It is desirable to make a membrane thin in order to accurately transfer a pattern. However, a thin membrane tends to be distorted because it is heated by the irradiation of an electron beam. Struts are conventionally formed in order to suppress a distortion and absorb heat.

In a preferable embodiment (a high current mode), the thickness of the membrane 502 is about 100 nm, but it may be in the range of about 50 nm to 500 nm. The width of the strut 502 is preferably in the range of 0.3 mm to 0.4 mm. The strut 504 is substantially thicker than the membrane 502, typically thicker by several orders of magnitude, so that it can give mechanical support and serves as a heat sink for the membrane 502. In the case of parallel membranes 502 as shown in the drawing, the width of the membrane 502 is preferably in the range of 0.6 mm to 0.8 mm so that heat on the membranes 502 can be transmitted to the struts.

As shown clearly in FIG. 6 (*b*), contact convection sections 501 are formed at positions corresponding to the strut 504 on the front side of the mask wafer 50. Although the contact convection sections 501 can be provided on all of positions corresponding to the strut 504, they may also be interspersed at places where heat generated by irradiating an electron beam can sufficiently be transmitted to the resist layer. For example, the contact convection sections 501 can be provided around the periphery of the mask, including at locations defined at the corner of each mask as shown. A contact convection section may be formed by depositing silicon on the surface of the mask 50 or formed by removing the circumference of the contact convection section by etching so that the contact convection section remains intact.

In another preferable embodiment (a low current mode), the width of the strut 502 may be in the range of 2.0 mm to 3.0 mm. The width of the membrane 502 may be in the range of 3.06 mm to 6.0 mm.

Figure 7:
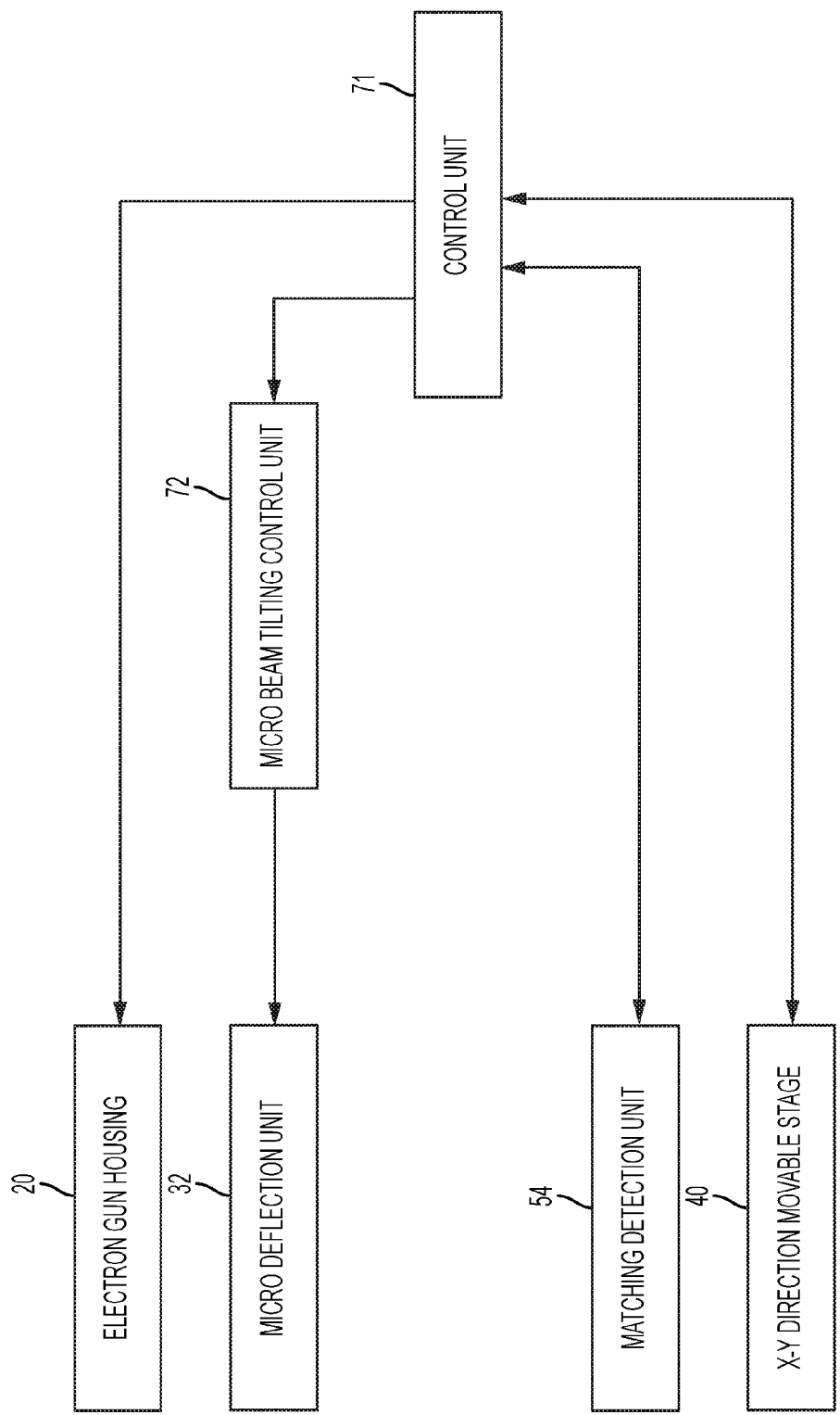
FIG. 7 shows a control system for carrying out exposure with electron beams by controlling the system of the invention.

FIG. 7 shows a control system of controlling a system (device) for actualizing an integrated circuit device in which the size of an object having a characteristic is from 10 nm to 20 nm. A control unit 71 is connected to the electron gun housing 20 to control the accelerating voltage, electric current and diameter of an electron beam so that a prescribed linear electron beam can be formed. The electron beam calibration unit 33 is connected to the control unit 71 in order to calibrate an electron beam from the electron gun housing. The control unit 71 is connected to the movable stage, which can be moved in the X-Y directions, to control the movement of the stage so that an electron beam can be irradiated on the entire mask.

The pattern alignment error detection unit 54 is connected to the control unit 71. The accuracy of matching between a semiconductor wafer and a mask is desirably 50 nm or less, and the degree of the pattern misalignment is detected by the pattern alignment error detection unit 54, and its detection data is sent to the control unit 71 and further sent to the micro beam inclination unit 72 together with data about the irradiation position of an electron beam.

The micro deflection unit 32 is connected to the micro beam inclination control unit 72. The micro beam inclination control unit 72 gives an output based on data from pattern alignment error detection unit 54 as well as data about the irradiation position to the micro deflection unit 32 in order to incline an electron beam.

The following describes the operation of transferring a mask pattern to a resist layer of a semiconductor wafer by the present system (device), wherein n is 2.

First, a semiconductor wafer (which is referred to as a "chip wafer") on which a pattern is to be transferred is disposed on the wafer stage 43, which is disposed on and installed to the movable stage 40. On the upper surface of this chip wafer, an electron-sensitive resist layer has been formed.

A mask wafer, which has the same shape as the chip wafer and is provided with a plurality of 2 division complementary masks having a pattern as shown in FIG. 4 (*a*), and a mask wafer provided with a plurality of 2 division complementary masks having a pattern as shown in FIG. 4 (*b*) are prepared, and first, one of those mask wafers is disposed on the mask stage 46 in such a manner that the contact convection section 501 formed on the front side (the lower side in the drawing) of the mask wafer comes into contact with the resist layer, and thus the mask wafer is disposed at a prescribed position above the mask wafer (the interval between the resist layer and the mask wafer is in the range of about 10 nm to about 300 nm and preferably is 50 nm).

The chip wafer and the mask wafer are fixed by the wafer stage 43 and the mask wafer 46 so that both wafers can be moved together in the X direction and the Y direction by the movable stage 40 (e.g., in the case of a wafer of 30 cm, the stage can be moved by 3 cm in the direction of the arrangement of the columns 21 each having a diameter of 3 cm and by 30 cm in the direction perpendicular to the abovementioned direction).

The electron gun housing unit 20 is provided with a plurality of electron guns to form a plurality of electron beams, which are linear and parallel along the central axis line (6 beams in the drawing). The electron gun housing unit 20 is characterized by forming an electron beam having a linear path (about 15 cm in total length) along the central axis line without scanning the electron beam. Such an electron beam having a linear path has no space charge effect and can achieve and maintain excellent parallelism.

As described above, the electron gun housing unit 20 enables to irradiate electron beams on the entire surface of a mask wafer by moving the mask wafer (chip wafer) in the X direction and the Y direction using a movable stage without scanning those electron beams.

When the mask wafer is moved in the X direction and the Y direction under linear electron beams, an electron passes through the hole 503 formed on the membrane 502 (see FIG. 4) and then hits the resist layer 42 so that a pattern on the mask wafer can be transferred to the resist layer. No proximity effect occurs because the accelerating voltage of an electron beam used is from about 0.5 KV to about 5 KV.

After completing the irradiation, one mask wafer is replaced with the other mask wafer and is transferred to the pattern alignment error detection unit 54 together with the mask stage 46 and the wafer stage 43. At the pattern alignment error detection unit 54, a mark formed on the semiconductor wafer by the first irradiation is observed under a microscope through the alignment hole (see FIG. 5) formed on the mask wafer. If there is no positional misalignment, the mark on the semiconductor mask is on the optical axis of the microscope, which perpendicularly passes through the alignment hole on the mask wafer. If there is a positional misalignment, the mark is not on the optical axis, and therefore the table is minutely rotated around the X-axis, Y-axis and Z-axis so that the mark can be positioned on the optical axis. By calculating a positional misalignment based on the rotational angle of each axis, the minute inclination angles of the electron beam are determined.

The mask wafer is always united with the semiconductor wafer through the integrated mask stage 46 and semiconductor wafer stage 43.

Figure 8:
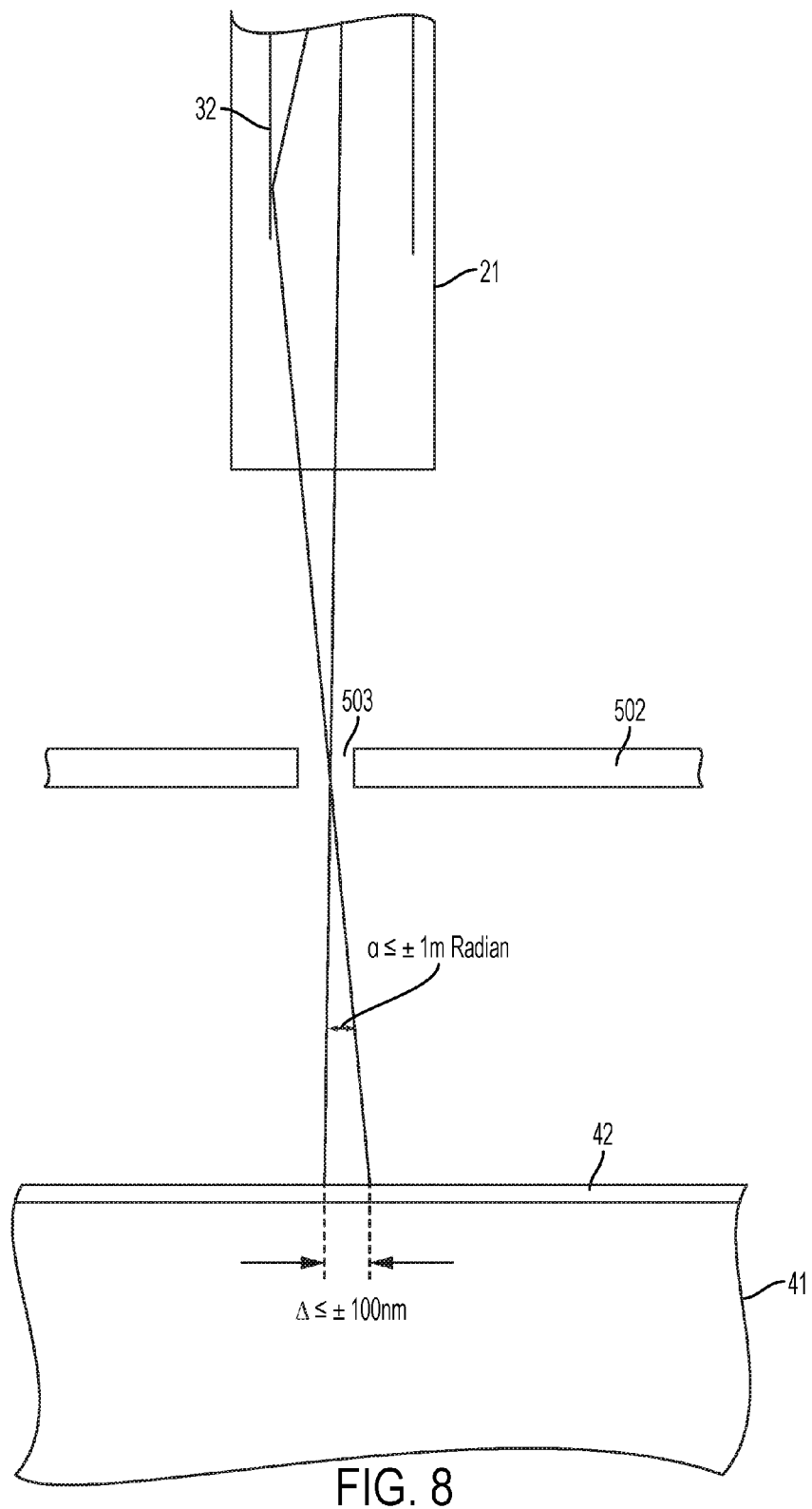
FIG. 8 shows an electron beam incident on a resist layer, wherein the electron beam is inclined in response to a deviation.
Figure 9:
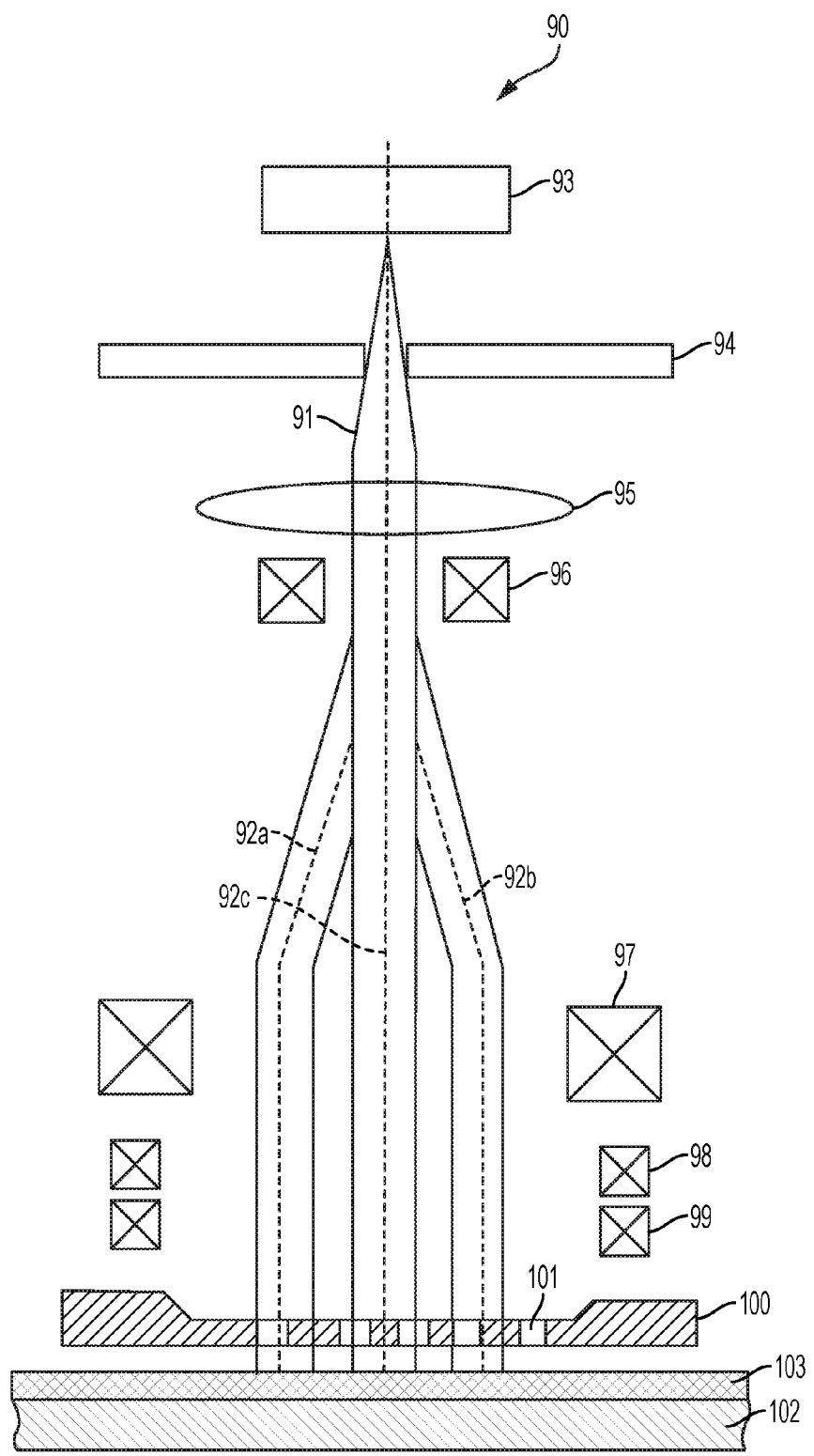
FIG. 9 is a schematic view of a conventional exposure system.

As shown in FIG. 8, an electron beam emitted from the column 21 linearly advances downward, passes through the alignment hole 503 of the membrane 502 and then hits the resist layer 42. If the pattern alignment error detection unit 54 detects no positional misalignment, an electron beam is not tilted.

If the pattern alignment error detection unit 54 detects a positional misalignment, the micro beam inclination control unit 72 specifies a column that requires angular adjustment from among a plurality of the columns 21. The micro deflection unit 32 of the specified column inclines an electron beam based on the specified minute inclination angle. This inclination of the electron beam enables to transfer the pattern on the mask wafer onto the resist of the semiconductor wafer.

The above description is about a transfer step when n is 2, and therefore if the number of n is increased, electron beams are irradiated in a manner similar to that described above for the number of mask wafers increased accordingly.

The inclination of an electron beam carried out by a micro deflection unit (electrode) is in the range of +/−1 mrad. However, no distortion caused by heat occurs because heat on a mask wafer is transferred to a resist layer through not only struts but the contact convection sections 501 on the mask wafer as well. Hence, by inclining an electron beam by the micro deflection unit (electrode) on the basis of a detected positional misalignment, it is possible to make the electron beam hit the resist layer at an accurate position. As a result, a pattern on the mask wafer can accurately be transferred to the resist layer.

The specified embodiment described above is nothing but one example of the general principle of the invention, and therefore it should be appreciated that other embodiments can also be designed by those skilled in the art without deviating from the spirit and scope of the present invention. For example, if the density of elements of an integrated circuit increases, it is useful for using masks of n division complementary mask type (n is an integer equal to or larger than 3). The physical structures of the mask and wafer stage may be different from those described above. By way of example, each one of those can essentially be made into a flat surface, and a mask and wafer may be held at a prescribed positon by electrostatic force.

EXPLANATION OF REFERENCE NUMERALS

10 System
11 Casing
20 Column
33 Electron beam calibration unit
40 Movable stage
41 Semiconductor wafer (chip wafer)
42 Resist layer
43 Wafer stage
46 Mask stage
50 Mask wafer
51 Semiconductor wafer storage unit
52 Mask wafer storage unit
53 Monitoring unit
54 Pattern alignment error detection unit

What is claimed:

1. A system for drawing a pattern on an electron-sensitive resist layer covering a semiconductor wafer, the system comprising:

an electron gun housing unit provided with a plurality of small-sized electron guns arranged in parallel with each other, wherein each of the electron guns forms a linear electron beam along the central axis line, each of the electron guns has a hollow column section for emitting the formed electron beam, and a micro deflection unit is disposed inside the column section for adjusting the inclination of the electron beam passing inside by a minute angle;

a movable stage disposed below the electron gun housing unit and capable of moving in the X-Y directions;

a wafer stage disposed on the movable stage to support a semiconductor wafer; a mask wafer having at least one n division complementary mask (n is equal to or greater than 2), which has struts on the rear side for supporting membranes in which a pattern to be transferred to the resist layer is formed;

a mask stage that holds the mask wafer peripherally and is disposed at a prescribed position above the semiconductor wafer held on the wafer stage in such a manner as to be integrated with the wafer stage;

a pattern alignment error detection unit for detecting a misalignment between patterns on the mask wafer and patterns on the semiconductor wafer; and an inclination means having an input connected to an output of the pattern alignment error detection unit for generating a correction signal in an output connected to an input of the micro deflection unit in order to compensate for a misalignment between patterns on the mask wafer and patterns on the semiconductor wafer and minimize a placement error of the pattern, wherein the movable stage is moved in the X direction and the Y direction in order to irradiate electron beams emitted from the plurality of hollow columns in the electron gun housing unit over the surface of the mask wafer held on the mask stage.

2. The system according to claim 1, wherein the accelerating voltage of the electron beam is in the range of about 0.5 KV to about 5 KV, the electric current of the electron beam is in the range of about 50 microamperes to about 1000 microamperes, and the diameter of the electron beam is in the range of about 1 mm to about 9 mm.

3. The system according to claim 2, wherein the front side of the mask wafer has a contact convection section at least on a portion of a place corresponding to the strut, and when the mask wafer is disposed above the semiconductor wafer, the contact convection section comes into contact with the resist layer of the semiconductor wafer.

4. The system according to claim 3, wherein: the thickness of the resist layer is in the range of about 10 nm to about 300 nm; the thickness of the membrane is in the range of about 50 nm to 500 nm; the resist layer of the semiconductor wafer is separated from the mask wafer disposed above the semiconductor wafer in the range of about 10 μm to about 300 μm.

5. The system according to claim 4, wherein the semiconductor wafer comprises a non-metallic conductive layer having a thickness in the range of about 50 nm to 500 nm under the resist layer.

6. The system according to claim 4, wherein: the accelerating voltage of the electron beam is about 2 KV; the electric current of the electron beam is about 200 microamperes; the diameter of the electron beam is about 3 mm; n is 2; the thickness of a membrane in a 2 division complementary mask is about 100 nm; the mask wafer is separated from the resist layer of the semiconductor wafer by about 50 microns; and the thickness of the resist layer is about 20 nm.

7. The system according to claim 6, wherein: the strut is made of single crystal silicon, is thicker than the membrane, and acts as a heat sink for the membrane; and the membrane is a conductive layer selected from the group consisting of doped silicon, silicide and a conductor.

8. The system according to claim 7, wherein the non-metallic conductive layer is one from the group consisting of materials such as hydrocarbon resists, and amorphous carbon.

9. The system according to claim 8, wherein the thickness of the non-metallic conductive layer is about 50 nm.

10. The system according to claim 1, wherein the semiconductor wafer is a chip semiconductor wafer having a plurality of regions on which individual integrated circuits are formed.

11. A method for drawing a pattern on an electron-sensitive resist layer, which covers a non-metallic conductive layer covering a semiconductor wafer, in the production of silicon integrated circuits, the method comprising:
a step of disposing a wafer stage that is positioned below an electron gun housing unit provided with a plurality of small-sized electron guns, which are arranged in parallel with each other, and holds a semiconductor wafer on a movable stage, which can be moved in the X-Y directions, wherein each of the electron gun forms a linear electron beam along the central axis line, each of the electron gun has a hollow column section for emitting the formed electron beam, and a micro deflection unit is disposed inside the column section for adjusting the inclination of the electron beam passing inside by a minute angle;
a step of disposing a mask wafer above the semiconductor wafer held by the wafer stage by using a mask stage holding the mask wafer peripherally, the mask wafer having at least one n division complementary mask (n is equal to or greater than 2), which has struts on the rear side for supporting membranes, on the inner side of which a pattern to be transferred to the resist layer is formed; a step of moving the movable stage in the X direction and the Y direction in order to irradiate electron beams emitted from the plurality of hollow columns of the electron gun housing unit over the surface of the mask wafer held by the mask stage;
a step of detecting a misalignment between patterns on the mask wafer and patterns on the semiconductor wafer and generating a misalignment correction signal; and
a step of applying the correction signal to the micro deflection unit for adjusting the inclination of the electron beams in order to compensate for the misalignment between patterns on the mask wafer and patterns on the semiconductor wafer and minimize a placement error of the pattern transfer process.

12. The method according to claim 11, wherein the accelerating voltage of the electron beam is in the range of about 0.5 KV to about 5 KV, the electric current of the electron beam is in the range of about 50 microamperes to about 1000 microamperes, and the diameter of the electron beam is in the range of about 1 mm to about 9 mm.

13. The method according to claim 12, wherein the front side of the mask wafer has a contact convection section at least on a portion of a place corresponding to the strut, and when the mask wafer is disposed above the semiconductor wafer, the contact convection section comes into contact with the resist layer of the semiconductor wafer.

14. The method according to claim 13, wherein: the thickness of the resist layer is in the range of about 10 nm to about 300 nm; the thickness of the membrane is in the range of about 50 nm to 500 nm; the resist layer of the semiconductor wafer is separated from the n division complimentary mask disposed above the semiconductor wafer in the range of about 10 μm to about 300 μm.

15. The method according to claim 14, wherein the semiconductor wafer comprises a non-metallic conductive layer having a thickness in the range of about 50 nm to 500 nm under the resist layer.

16. The method according to claim 12, wherein he accelerating voltage of the electron beam is about 2 KV; the electric current of the electron beam is about 200 microamperes; the diameter of the electron beam is about 3 mm; n is 2; the thickness of a membrane is about 100 nm; the mask wafer is separated from the resist layer of the semiconductor wafer by about 50 microns; and the thickness of the resist layer is about 20 nm.

17. The method according to claim 16, wherein the strut is made of single crystal silicon, is thicker than the membrane, and acts as a heat sink for the membrane; and the membrane is a conductive layer selected from the group consisting of doped silicon, silicide and a conductor.

18. The method according to claim 17, wherein the non-metallic conductive layer is (made of) one from the group consisting of materials such as hydrocarbon resists, and amorphous carbon.

19. The method according to claim 18, wherein the thickness of the non-metallic conductive layer is about 50 nm.

\* \* \* \* \*